United States Patent

Feinberg

[11] Patent Number: 5,952,827
[45] Date of Patent: Sep. 14, 1999

[54] TIME VARYING READ AND PHASE GRADIENTS WHERE THE DURATION OF THEIR OVERLAP VARIES OR THE SUM OF THEIR DURATIONS IS CONSTANT

[76] Inventor: David Feinberg, 41 Hanzel La., Schokan, N.Y. 12481

[21] Appl. No.: 08/838,406

[22] Filed: Apr. 7, 1997

Related U.S. Application Data

[63] Continuation-in-part of application No. 08/724,445, Oct. 1, 1996.

[51] Int. Cl.$^6$ ......................................................... G01V 3/00
[52] U.S. Cl. ............................................ 324/309; 324/307
[58] Field of Search ..................................... 324/300, 307, 324/309, 312, 314; 600/410

[56] References Cited

U.S. PATENT DOCUMENTS

| | | | |
|---|---|---|---|
| 4,940,940 | 7/1990 | Rzedzian | 324/312 |
| 5,245,282 | 9/1993 | Mugler, III et al. | 324/309 |
| 5,361,028 | 11/1994 | Kanayama et al. | 324/309 |
| 5,621,321 | 4/1997 | Liu et al. | 324/309 |

*Primary Examiner*—John Barlow
*Assistant Examiner*—Paul A. LaViolette
*Attorney, Agent, or Firm*—Cooper & Dunham LLP

[57] ABSTRACT

An MRI method and system in which phase gradients and read gradients overlap over varying time durations. The MRI signals sampled while there is no overlap fill a non-rectangular matrix in K-space. Alternately, the MRI signal is sampled during the times of overlap as well but a zero is placed at the corners of the matrix at locations which correspond to overlap. The benefit include a reduction in the MRI data acquisition time for the same spatial resolution as known sequences, an increase in image spatial resolution for the same MRI data acquisition time as known sequences, lower signal bandwidth and increase the image signal-to-noise ratio (SNR). In addition, in a gradient echo MRI sequence, the read and write gradients do not overlap in time but vary in width (or at least one of the them varies in width) with time to achieve similar advantages.

23 Claims, 14 Drawing Sheets

TIME VARYING READ AND PHASE GRADIENTS WHERE THE DURATION OF THEIR OVERLAP VARIES OR THE SUM OF THEIR DURATIONS IS CONSTANT

REFERENCE TO RELATED APPLICATIONS

This application is a continuation-in-part of parent patent application Ser. No. 08/724,445 filed Oct. 1, 1996. Said parent application is hereby incorporated in its entirety by reference in this application as though fully set forth herein.

BACKGROUND OF THE INVENTION

The invention is in the field of magnetic resonance imaging (MRI) and pertains to the use of pulse sequences which seek to optimize trade-offs between parameters such as data acquisition time, signal-to-noise ratio (SNR), and image resolution. Two such pulse sequences are known under the names RARE and GRASE and are discussed in Feinberg D A, Kiefer B, and Litt A W. High Resolution GRASE MRI of the Brain and Spine: 512 and 1024 Matrix Imaging. *J Compu Assist Tomogr* 1995; 19(1): 1–7. The cited article is hereby incorporated by reference.

Spin echo trains produced with the Carr-Purcell-Gill-Meiboom (CPMG) pulse sequence can be useful for MRI. For example, as illustrated in FIG. 1 and discussed in Mansfield P and Pykett E L. Biological and Medical Imaging by NMR. *J Magn. Resonance* 29, 355–373 (1978), an encoding methodology can accumulate phase shifts in successive signals by reversing the polarity of a constant absolute value amplitude gradient after each RF pulse. As seen in FIG. 1, a 90° radio frequency (RF) excitation signal is followed by a sequence of 180° rephasing RF pulses which are equally spaced in time from each other. A slice select gradient pulse Gs is active at times which coincide with each of the RF signals. A read gradient Gr is pulsed to be active during each interval between two successive 180° RF signals. A phase encode gradient Gp is pulsed to be active for each readout gradient pulse Gr (except for the read gradient which is active at time ko which corresponds to zero phase encoding). The Gp gradient pulses are centered relative to, and are longer and have lower amplitudes than, the Gr gradient pulses. In addition, the Gp gradient pulses alternate in sign but maintain the same absolute value amplitude and the same time duration (and, therefore, have a constant area). An MRI signal is sampled during each read gradient pulse Gr, to derive digital samples of the analog MRI signals illustrated at $k_0$, $k_1$, $k_2$, $k_3$, $k_4$, etc. These digitized MRI signals are stored in K-space in lines which are parallel to a frequency axis and are spaced from each other along a phase axis. The MRI signal for $k_0$ is stored at an origin of the phase axis. The lines typically conform to a square or rectangular area in K-space. An MRI image can be derived from the K-space matrix using, for example, known two-dimensional Fourier Transform (2D FT) image reconstruction techniques. While this method makes efficient use of data acquisition time because it uses Gr and Gp gradient pulses that overlap in time, it will typically create image artifacts because stimulated echoes and spin echoes have different magnetization pathways and stimulated echoes can be undesirably phase encoded. The stimulated echo magnetization can be stored in the longitudinal plane during some of the time intervals between successive 180° RF signals and may not experience the same number of switched phase encode gradient pulses as do the spin echoes, and their unequal phase can cause destructive interference in the net MRI signal.

One way to deal with stimulated echo artifacts involves phase rewind phase encoding as discussed in U.S. Pat. No. 4,697,148. Phase rewind encoding involves inserting a phase rewind gradient pulse to cancel the effect of the immediately preceding phase encoding gradient pulse. As a result, after each 180° rephasing RF signal, the spin echoes and the stimulated echoes both should have zero phase and should be subjected to a phase encode gradient pulse which concurrently and equally would encode them both so as to avoid phase incoherence.

As illustrated in FIG. 2, this phase rewind approach can be applied in CPMG pulse sequences. In FIG. 2, the RF signals and the Gr gradient pulses are as in FIG. 1, but the phase gradient pulses Gp now comprise a sequence of alternating phase encode and rewind gradient pulses in which each phase encode pulse is positive and precedes a read gradient pulse Gr which is followed by a phase rewind gradient pulse which is negative. The magnitudes (absolute values) of the phase gradient pulses decrease from the start toward the middle of the sequence, as illustrated in FIG. 2, and increase after the midpoint at $k_0$ in the sequence, where the phase encoding is zero (not shown in FIG. 2). One example of such phase rewind methodology for a fast CPMG is known as the RARE pulse sequence (also known as Turbo SE and FAST SE), as discussed in U.S. Pat. No. 4,818,940 (which refers to changing the intensity and/or duration of the phase encoding gradient after every 180° pulse), and a more recent example is the gradient and spin echo sequence known as GRASE.

SUMMARY OF THE INVENTION

One aspect of the invention is to make use of complementary changes in the pulse widths of the read gradients and the phase gradients. When applied to a CPMG pulse sequence, this approach can be called time-variable CPMG encoding, or TV CPMG. Data acquisition in the TV CPMG pulse sequence involves gradually reducing the duration of the MRI signal sampling times of the read gradients while increasing in a complementary manner the widths of the phase encode and phase rewind gradients, and vice versa. One benefit is a reduction in the MRI data acquisition time for the same spatial resolution as known CPMG pulse sequences. Another is an increase in the spatial resolution for the same MRI data acquisition time as known CPMG pulse sequences. Yet another is to lower signal bandwidth and increase the image signal-to-noise ratio (SNR). Still another is to secure some of the preceding three benefits by achieving some decrease in data acquisition time and/or signal bandwidth, and/or some increase in spatial resolution and/or SNR.

The MRI signals which are sampled in the TV CPMG pulse sequence can be stored in data lines which in K-space are parallel to the frequency axis and are spaced from each other along the phase axis. Thus, TV CPMG does not require interpolation or regridding of data as in the case of diagonal or certain other non-rectilinear K-space trajectories. However, unlike the case of conventional CPMG sequences, the sampled MRI data in the TV CPMG sequence is not a rectangle in K-space but takes the shape of useful K-space data in the form of a diamond-shaped grid, or a grid with an outline approximating a circle or grids having other shapes.

A broader aspect of the invention is a time varying overlap between read gradients and phase gradients in pulse sequences not limited to CPMG, such as in gradient echo pulse sequences using an RF excitation pulse selected for tipping magnetic moments to an angle α which need not be π/2, and in spin echo pulse sequences which typically have a π/2 RF signal followed by one or two π RF signals.

Gradient amplitude variations such as in spin warp pulse sequences can be combined with time varying overlap between read and phase gradients in accordance with the invention. Time varying overlap between read and phase gradients can be applied to a GRASE pulse sequence in accordance with the invention.

Another aspect of the invention pertains to using in certain pulse sequences, particularly gradient echo sequences, variable pulse width phase Gp and readout Gr pulses which are not overlapping. By changing these gradient pulse lengths in accordance with the invention, it is possible to achieve advantages similar to those discussed herein for the overlapping TV gradient pulses. A gradient echo MRI pulse sequence typically uses an RF excitation pulse α followed by a phase gradient pulse Gp and a readout gradient pulse Gr. The designation α for the RF pulse indicates an arbitrary flip angle in a gradient echo sequence. This set of an α RF pulse, a phase pulse Gp and a readout pulse Gr is repeated a number of times to form an MRI pulse sequence. If after each α pulse one of the Gp and the Gr pulses is changed appropriately in width, or both of the Gp and the Gr pulses are changed appropriately in width, longer maximum gradient pulses can be achieved for higher spatial resolution of an MRI image obtained therewith (larger K-space coverage) although the Gp and Gr pulses do not overlap in time. Alternatively, with variable width, non-overlapping gradient pulses Gp and Gr the α RF pulses can be moved closer together for faster MRI data acquisition and, therefore, faster MRI imaging. The time interval between the α RF pulses may but need not be equal. Such non-overlapping Gp and Gr pulses can be used to advantage in 2D as well as in 3D FT MRI imaging.

BRIEF DESCRIPTION OF THE DRAWINGS

FIG. 9 illustrates a diagonal K-space matrix or grid.

PREFERRED EMBODIMENTS

Figure 1:
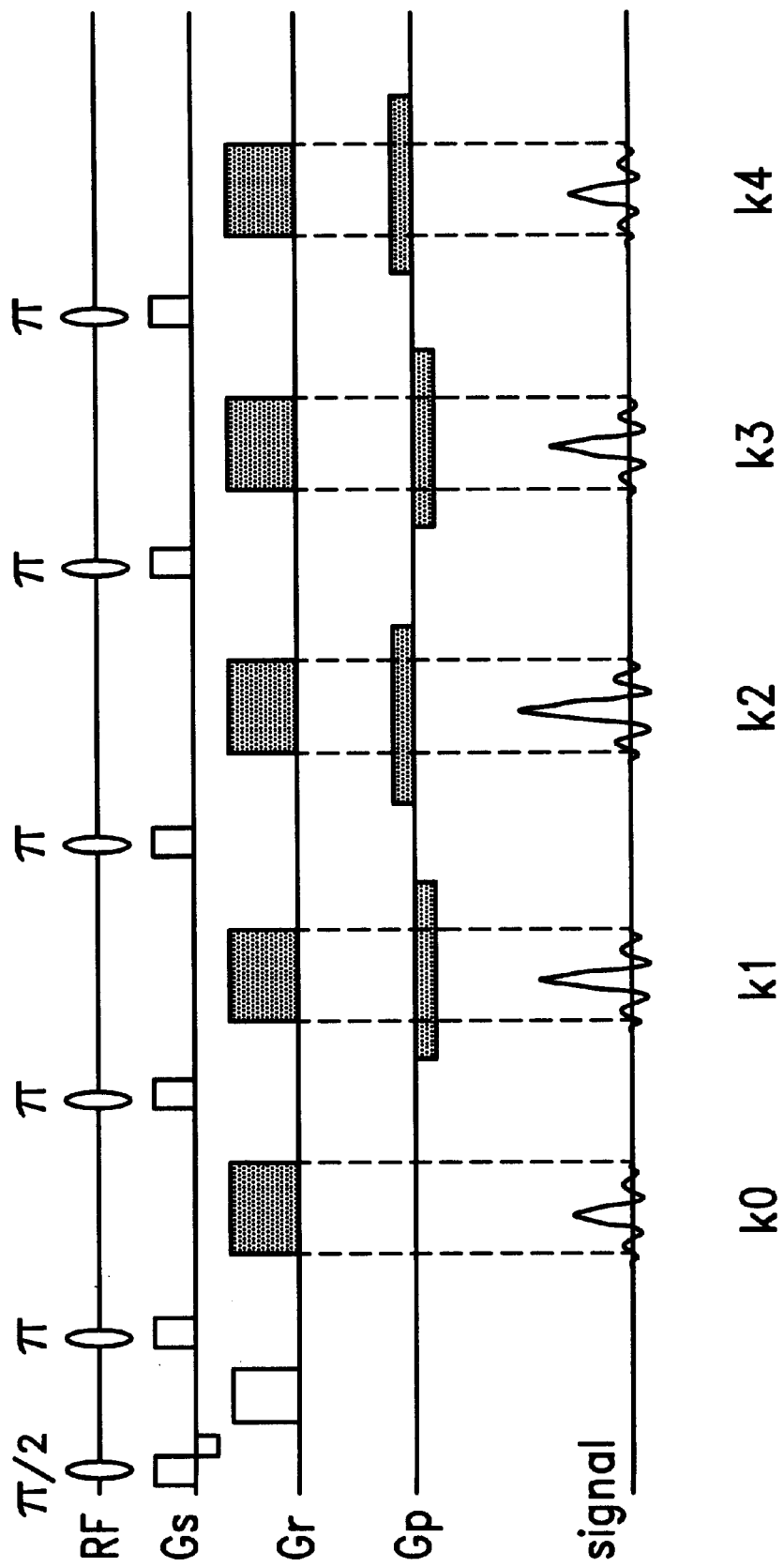
FIG. 1 illustrates a prior art MRI pulse sequence in which phase gradients that have constant amplitudes and pulse widths alternate.
Figure 2:
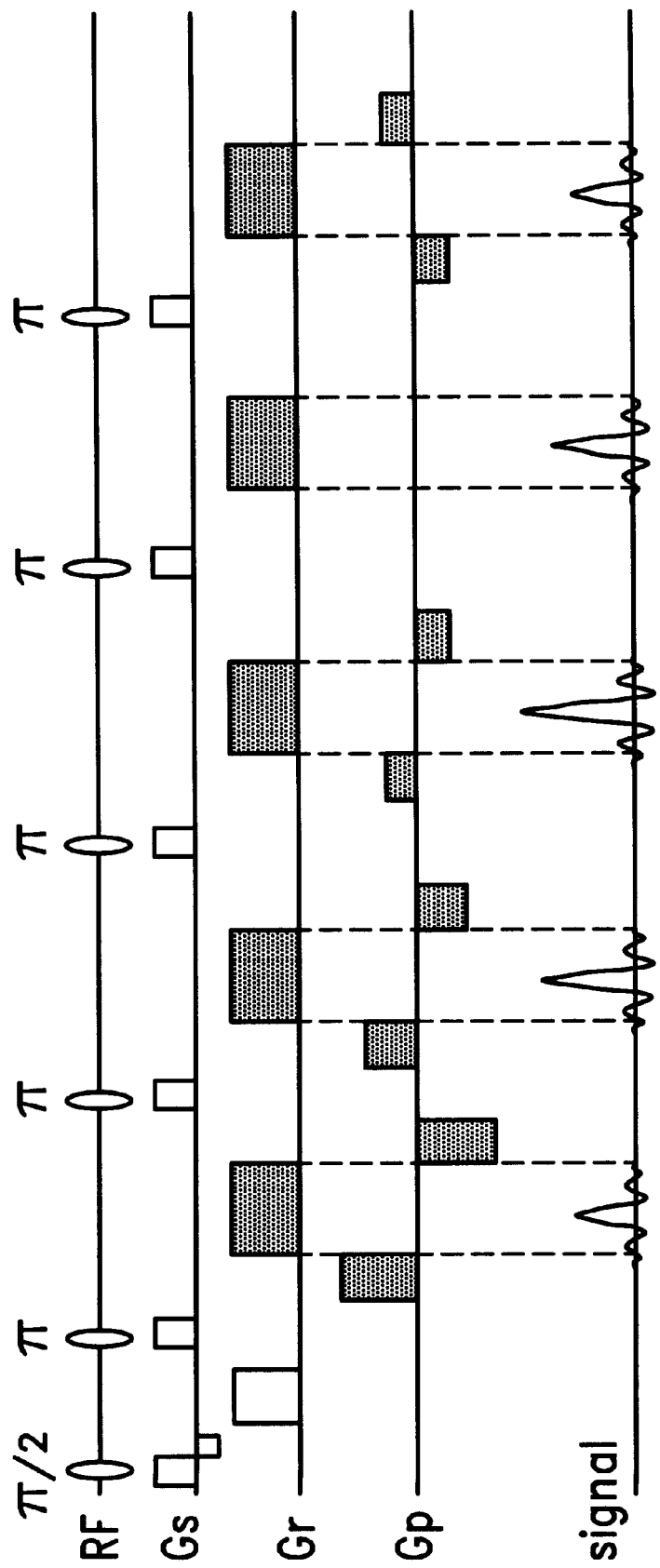
FIG. 2 illustrates a prior art CPMG pulse sequence (RARE) using phase encode pulses before and phase rewind pulses after the readout pulses such that only the amplitudes (but not the pulse widths) of the phase encode and rewind pulses vary.
Figure 3:
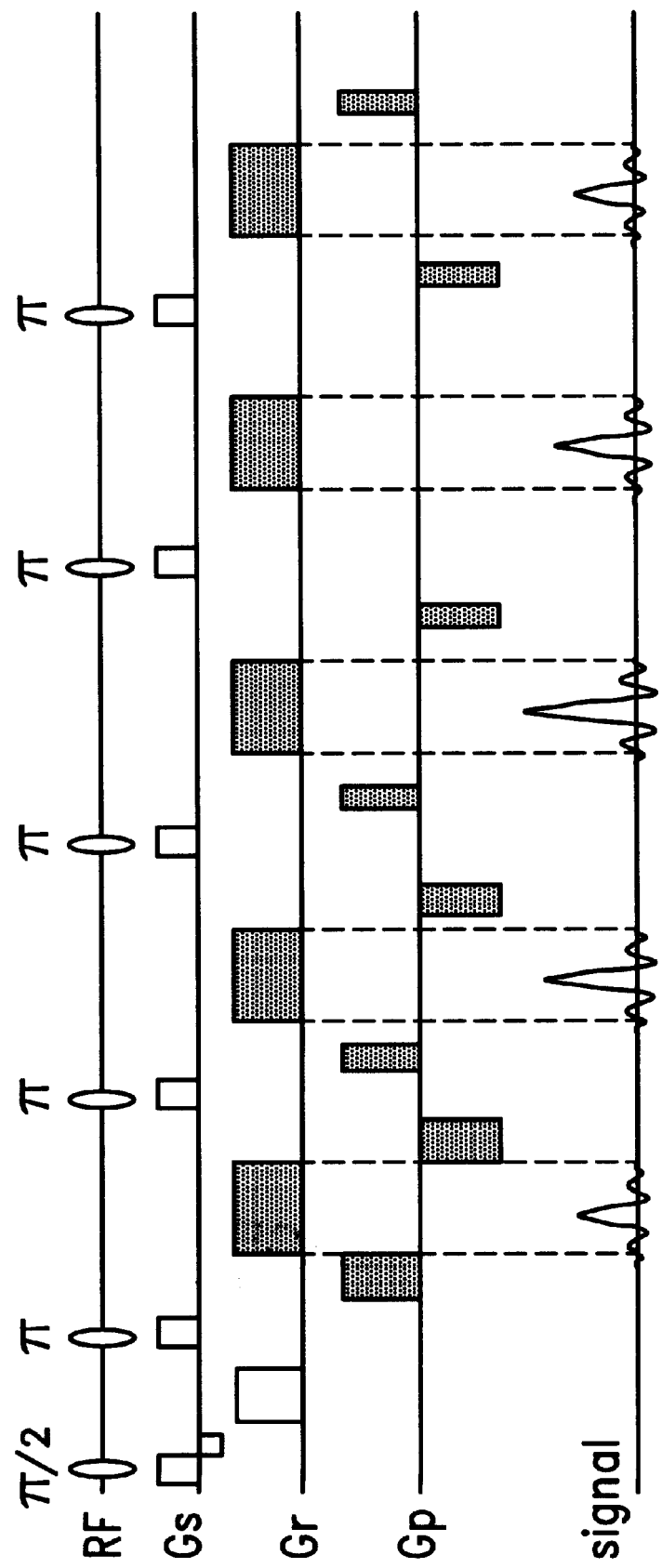
FIG. 3 illustrates a CPMG pulse sequence using phase encode pulses before and phase rewind pulses after the readout pulses such that only the pulse widths (but not the amplitudes) of the phase encode and rewind pulses vary.

As illustrated in FIG. 3, another approach to phase rewind is to keep constant the amplitude (absolute value) of the phase encode and phase rewind pulses at Gp so as to achieve through varying pulse widths the same variation of the areas of these phase encode and phase rewind pulses as is achieved in FIG. 2 through varying pulse amplitudes.

While the phase rewind method addresses stimulated echo artifacts, it is believed to be costly, partly due to the time spent on phase rewind gradient pulses but mainly because each phase encode value must be obtained without cumulative phase encoding effects from a single gradient pulse. Another contributing factor to time inefficiency is the perceived need of spacing the 180° RF signals equally in time in the CPMG sequence. The constant spacing between successive 180° RF signals in that sequence has to accommodate the pair of a constant duration phase encode and phase rewind pulses in the FIG. 2 sequence, or the pair of the longest phase encode pulse and phase rewind pulse in the FIG. 3 sequence. Either phase gradient amplitude variations as in FIG. 2 or phase pulse width variations as in FIG. 3 can be used in a RARE sequence, but the spacing between 180° RF signals is still set by the width of the readout pulse Gr corresponding to maximum spatial resolution and by the longest phase encode and phase rewind pulses in the sequence. It is believed that at least in part because of this time penalty, no great advantage would be achieved in time variable phase encoding over spin warp methods.

A pulse sequence in accordance with examples of the invention can be carried out in a current commercial MRI scanner which has a magnet for producing a main magnetic field, gradient coils for producing gradient magnetic fields, RF coils for producing RF signals, receiver coils for receiving MRI signals (which may be the same or different from the coils producing RF signals), a data acquisition system for acquiring and preparing them for MRI image reconstruction, an imaging system for processing the MRI signals into MRI images, and a control unit for controlling the gradient and RF coils and the data acquisition and imaging systems. Preferably, the control unit is programmable to implement different pulse sequences.

Figure 4:
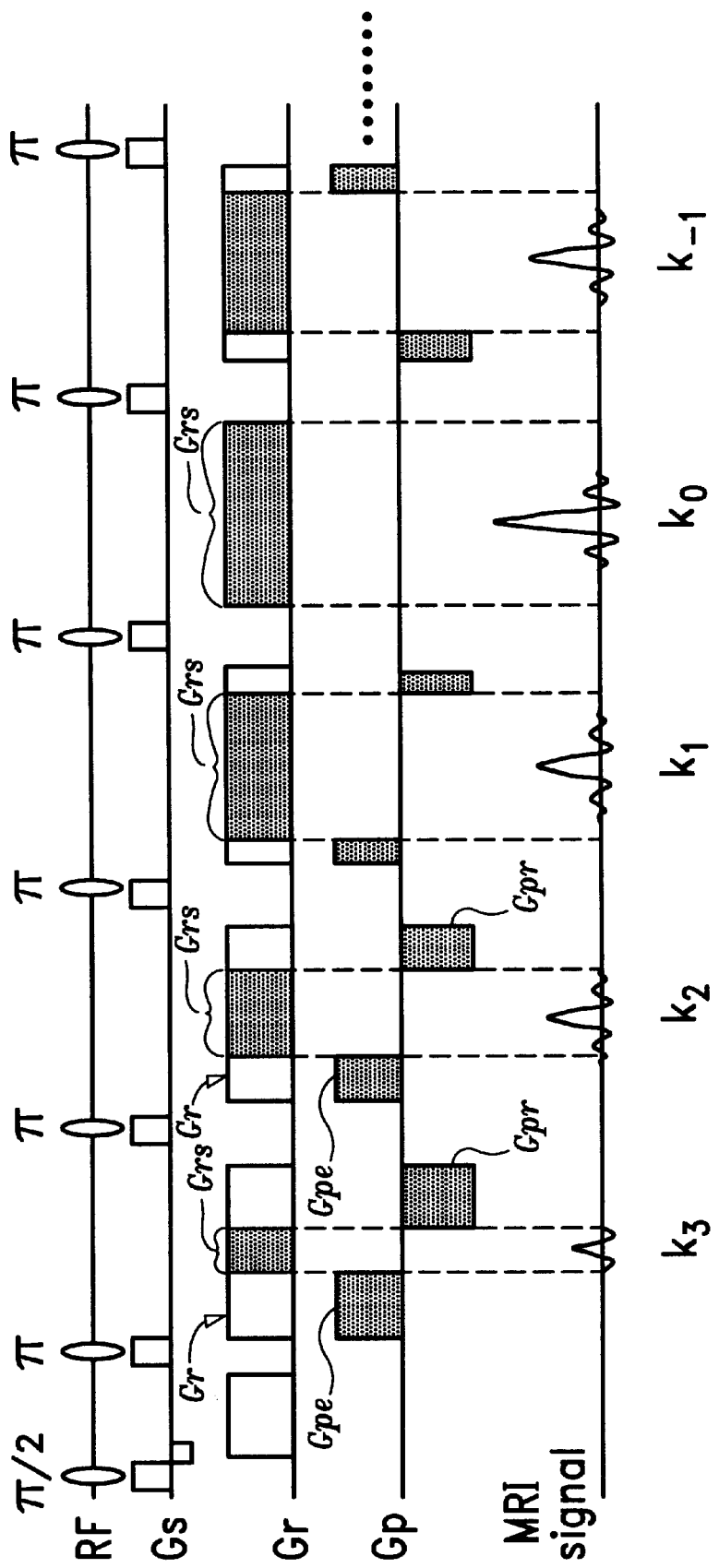
FIG. 4 illustrates a TV CPMG sequence in accordance with one example of the invention.

FIG. 4 illustrates a TV CPMG sequence in accordance with the invention in which 90° (π/2) RF excitation signal is followed after a time interval τ by a sequence of 180°(π) RF signals which are equally spaced from each other by a time interval 2τ. Each RF signal coincides in time with a respective slice selecting gradient pulse Gs as in the known CPMG pulse sequence. The read gradients Gr have equal pulse widths and are active in the time intervals between successive π RF signals. However, unlike the case of the known CPMG pulse sequence, in accordance with the invention as implemented in a TV CPMG pulse sequence, time varying phase gradients Gp overlap in time with respective read gradients Gr. In particular, each phase encode gradient Gpe (which is positive in this example) overlaps in time with an initial part of a respective read gradient Gr while a phase rewind gradient Gpr overlaps in time with a late portion of a respective read gradient Gr. As is conventional, no phase gradient is applied at the time of the read gradient for the $k_0$ MRI signal or, stated differently, the phase gradient is zero at the time of the read gradient Gr for $k_0$. For ease of illustration, only gradients for the MRI signals at $k_3$, $k_2$, $k_1$, $k_0$ and $k_{-1}$ are illustrated but it should be understood that in practice many more MRI signals (and corresponding sets of RF signals and gradients would be used (such as a total of 256 or 512 or 1024) and that typically the same number of MRI signals would be derived before and after the $k_0$ MRI signal.

In this example of the invention, the phase gradients become gradually shorter in time duration (decrease in pulse width) from the illustrated start of the sequence toward $k_0$ and then become gradually longer (increase in pulse width) toward the illustrated end of the sequence. While the sequence is shown with the longest phase gradients at the start and end of the sequence, in practice typically the $k_0$ sampling interval is first, then $k_1$ (or $k_{-1}$), then $k_{-1}$ (or $k_1$), then $k_2$ (or $k_{-2}$), etc.

In the example of FIG. 4, the MRI signal is sampled during the intervals Grs portions of the read gradients Gr which do not overlap with phase gradients. The durations of the phase gradients Gp and the sampling intervals Grs are complementary. Thus, the sum of the durations of the two phase gradients Gpe and Gpr and the sampling interval Grs between them is a constant. The longer phase gradients match shorter sampling intervals, and vice versa. The MRI signals can be digitized with variable analog-to-digital conversion (ADC) times (e.g., by digitizing only the MRI signal which is present when there is no overlap between Gr and Gp gradients), or the MRI signal present throughout the active times of the Gr gradients can be digitized, followed by zero filling selected K-space locations (e.g., storing zero in the locations which correspond to times of overlap of Gr and Gp gradients).

Figure 5A:
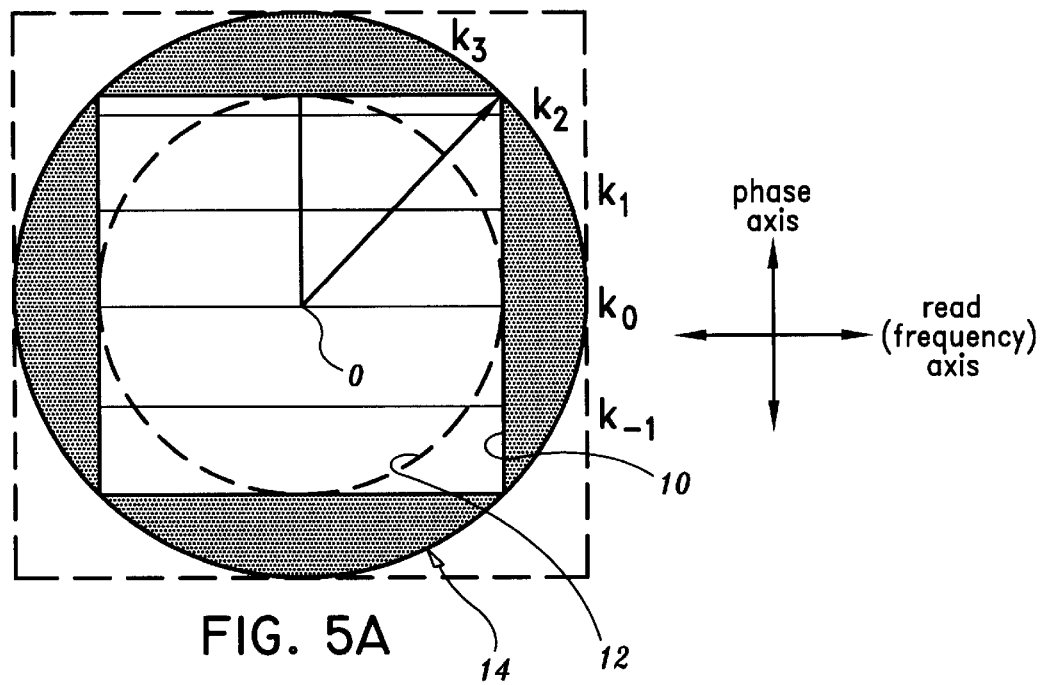
FIGS. 5a and 5b illustrate the storage of MRI signals in K-space.

Referring to FIG. 5a, the sampled MRI signal is stored in K-space in a manner which can be conceptualized as storing the signals at lines which are parallel to a read (or frequency) axis and are spaced from each other along a phase axis. In fact, the sampled signals typically are stored in computer memory in an appropriate sequence. In the conceptualized K-space grid or matrix, the MRI signal sampled at ko are stored in the horizontal data line in the middle of FIG. 5a such that the sample taken at the middle of the read gradient Gr $k_0$ is stored at the middle of that line; the samples taken during the sampling interval Grs for $k_1$ are stored in the line above, with the sample at the middle of that MRI signal being stored at the middle of that line, etc. While in a conventional CPMG pulse sequence the lines in K-space typically have the same length and occupy a square or rectangular area in K-space, in accordance with the invention they can and typically occupy a different area, given the variable overlap between Gr and Gp gradients. The TV CPMG sequence can be used to obtain higher spatial resolution images than the conventional CPMG sequence because the TV CPMG sequence achieves longer gradient areas of Gpe and Gr. The distance in K-space on the read axis and on the phase axis corresponds to the area under the Gpe pulse and half the area under the Gr pulse, respectively.

Figure 5B:
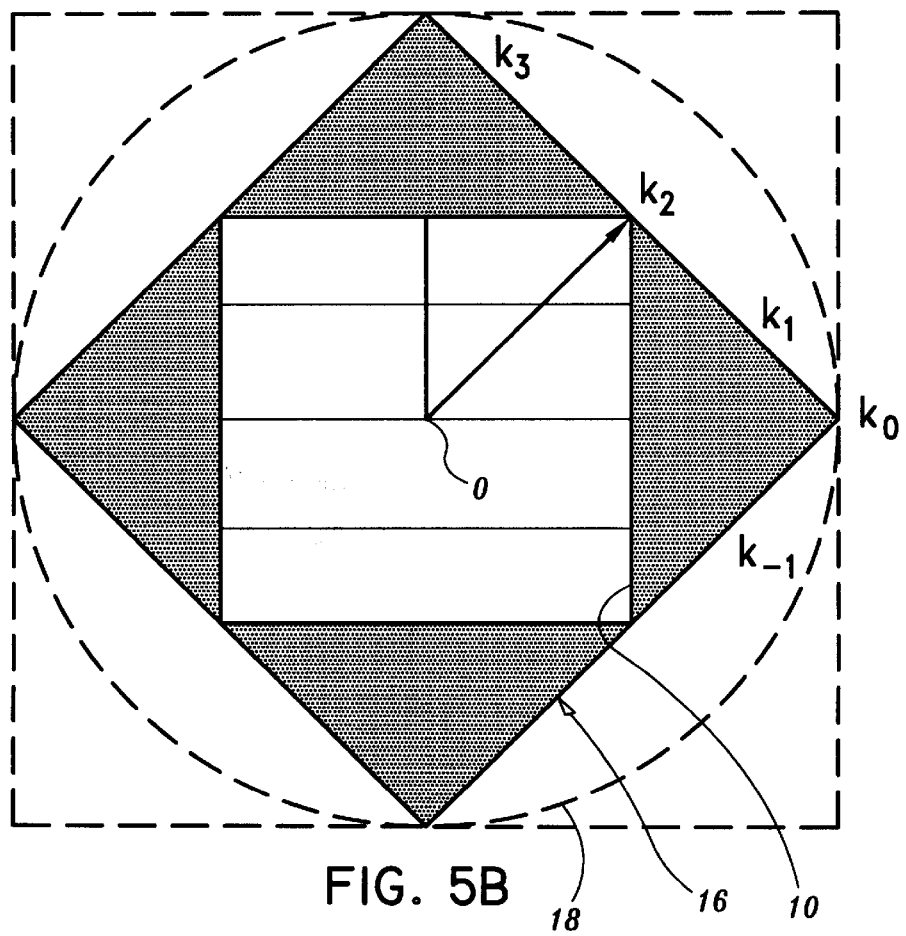

Referring to FIGS. 5a and 5b, while in a known CPMG sequence the MRI signals typically are stored in the square area 10, in accordance with the invention they can be stored in a differently shaped area, for example in the circular area 12 or in the larger circular area 14 or in the diamond-shaped area 16.

Spatial resolution is determined by the distance from the origin O in K-space. Thus, circle 12 defines an area of isometric resolution. However, in the rectangle 10, the corners which are outside the circle 12 include higher spatial frequency than is possible to display in pixels whose dimensions are determined by the sides of the rectangle 10. In effect, the corners are oversample information. In accordance with the invention, for isometric spatial resolution data acquisition time can be reduced by only collecting and storing MRI signals for the data lines in K-space which are within circle 12, or resolution can be increased by collecting and storing MRI signals for the data lines within the larger circle 14, or some decrease in data acquisition time and some increase in resolution can be achieved by only collecting and storing MRI signals for the data lines in K-space which are within a circle which is concentric with and is between circles 12 and 14. If maximum K-space coverage is desired, MRI signals can be collected with a maximum overlap of Gpe and Gr and stored in the data lines in K-space which are within the diamond-shaped area 16 in FIG. 5b. Still in accordance with the invention, MRI signals can be collected and stored for a smaller diamond-shaped area in K-space, or for a differently shaped area. The MRI data stored in K-space can be reconstructed into MRI images using known FT reconstruction processes of the types which are believed to be currently used commercially by at least some of the major MRI manufacturers.

Zero filling of corners in K-space to improve signal-to-noise ratio (SNR) in the MRI image is another aspect of the invention. Specifically, the MRI signals can be sampled during some or all of the time during which the read and phase gradients overlap in time but a zero is stored in the corresponding points on the data lines in K-space rather than the actual MRI signal sample. Referring to FIG. 5b, a zero can be stored in some or all of the portions of the data lines which would extend from the diamond shaped area 16 to the largest circle 18. Alternately, referring to FIG. 5a, MRI data is acquired for the full lines within rectangle 10 but the corners of that rectangle which are outside circle 12 correspond to the times when the read and phase gradients overlap. These portions of the data lines (between rectangle 10 and circle 12) are zero-filled to improve the SNR in MRI images reconstructed from the MRI signals stored in this manner in K-space. In one test of this aspect of the invention, it is believed that an improvement of approximately 5% was achieved as compared to a RARE pulse sequence using an identical matrix size, signal read period duration (same bandwidth) and all other timing factors (such as TR, $TE_{effective}$). The increased SNR was evidenced in a reduced noise level as measured by standard deviation in either air or a uniform homogeneous object (phantom) while the mean image intensity remained constant as between the RARE image and the TV (time varying overlap) image resulting from using zero filling in accordance with the invention. There was no measurable difference in image resolution between the two images when comparing blurring or Gibbs ringing differences between variably spaced small plastic rods within the uniform phantom.

It is believed that in high resolution imaging, when the energy or intensity of signal in the corner regions of a rectangular area in K-space (such as at 10 in FIG. 5a) tends to be negligibly low compared to the more central portion, the noise in the corner regions tends to be the dominant contribution to the signal-to-noise ratio in the final image. This noise contribution from the corner regions tends to raise the noise in the image, but can be substantially totally eliminated by zero filling in accordance with the invention. By delineating the corners of a rectangular K-space area (such as 10 in FIG. 5a) by the inner radius of a circular K-space coverage (such as 12 in FIG. 5a), the amount of noise removed from the FT image reconstruction process corresponds to the ratio of the area of the remaining circle in K-space (such as circle 12) to the area of the original rectangle (such as rectangle 10). This calculates to 0.78 times the original noise, or a 22% reduction in noise. By taking the reciprocal and square root, this leads to a 13.2% improvement in image SNR. Higher noise reduction and better SNR improvement can be achieved in accordance with the invention by zero filling corners in K-space in the case of three-dimensional MRI data acquisition, where the noise reduction would correspond to the ratio of the volume of a sphere to the volume of a cube having a side equal to the sphere's diameter, which calculates to reducing noise by 0.52 and to a 38.2% higher image SNR in such 3D images. Of course, these values of SNR assume no image intensity contributions from the corner regions, thus the maximum attainable SNR gain. This aspect of the invention also contemplates zero filling less than the entire corner regions, in which case a lesser reduction in noise and a lesser SNR improvement would be obtained.

Stated differently, while it can be assumed that the MRI signal in the corner regions of a rectangular matrix in K-space would contain information, this is information at higher spatial frequency than the pixel size in the image. Accordingly, because the noise contribution of this high spatial frequency information is expected to be randomly distributed, it is believed that such noise contribution outweighs any benefit to signal intensity in the image from using the high spatial frequency information in FT image reconstruction. Accordingly, in accordance with the invention it is believed that while zero filling these corners in K-space prior to FT reconstruction eliminates some image information, the net effect of using such zero filing is to improve the MRI image.

Figure 6:
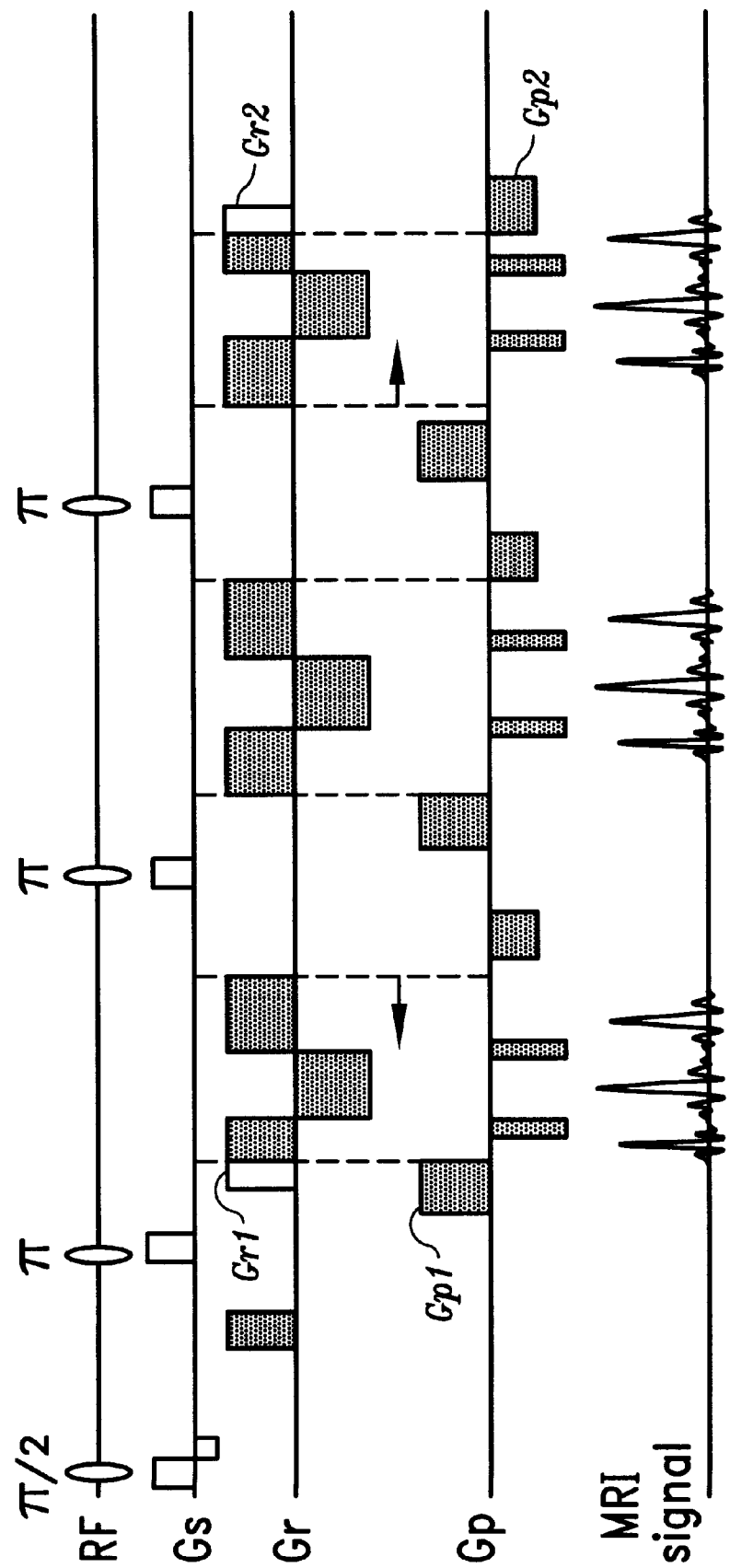
FIG. 6 illustrates a TV GRASE sequence in accordance with an example of the invention.

FIG. 6. is another example of using time varying overlap in accordance with the invention, this time as applied to a GRASE pulse sequence. As in the known GRASE sequence, the $\pi/2$ RF signal is followed by a train of $\pi$ RF signals, and three gradient rephasings follow each $\pi$ RF signal. Also as in the known GRASE sequence, a sequence of a positive phase gradient, then two negative phase gradients and then a positive phase gradients is used, and the areas of these phase gradient pulses are such that their algebraic sum is zero for each interval between successive $\pi$ RF signals. However, unlike the case of the known GRASE sequence, where the read gradients and the phase gradients are active at different times, in the TV GRASE sequence in accordance with the invention read gradients and phase gradients overlap in time to achieve benefits corresponding to those discussed above in connection with the TV CPMG sequence. One example is illustrated in FIG. 6, where the first phase gradient Gp1 overlaps in time with the first read gradient Gr1 which is after the first $\pi$ signal, and the last phase gradient Gp2 overlaps in time with the last read gradient Gr2 which is after the last $\pi$ signal that follows the $\pi/2$ signal. The same would apply to other trains if a $\pi/2$ signal followed by $\pi$ signals in the TV GRASE sequence. The resulting MRI signals can be sampled only when there is not overlap between read gradients and phase gradients or can be sampled when there is overlap as well, and stored in K-space in a manner corresponding to that discussed above in the case of the TV CPMG sequence. The MRI signal generated at times when the phase gradients and read gradients overlap can be considered to be corrupted, and in accordance with one aspect of the invention a zero value is stored in each location in the K-space grid which corresponds to such corrupted data.

Figure 7:
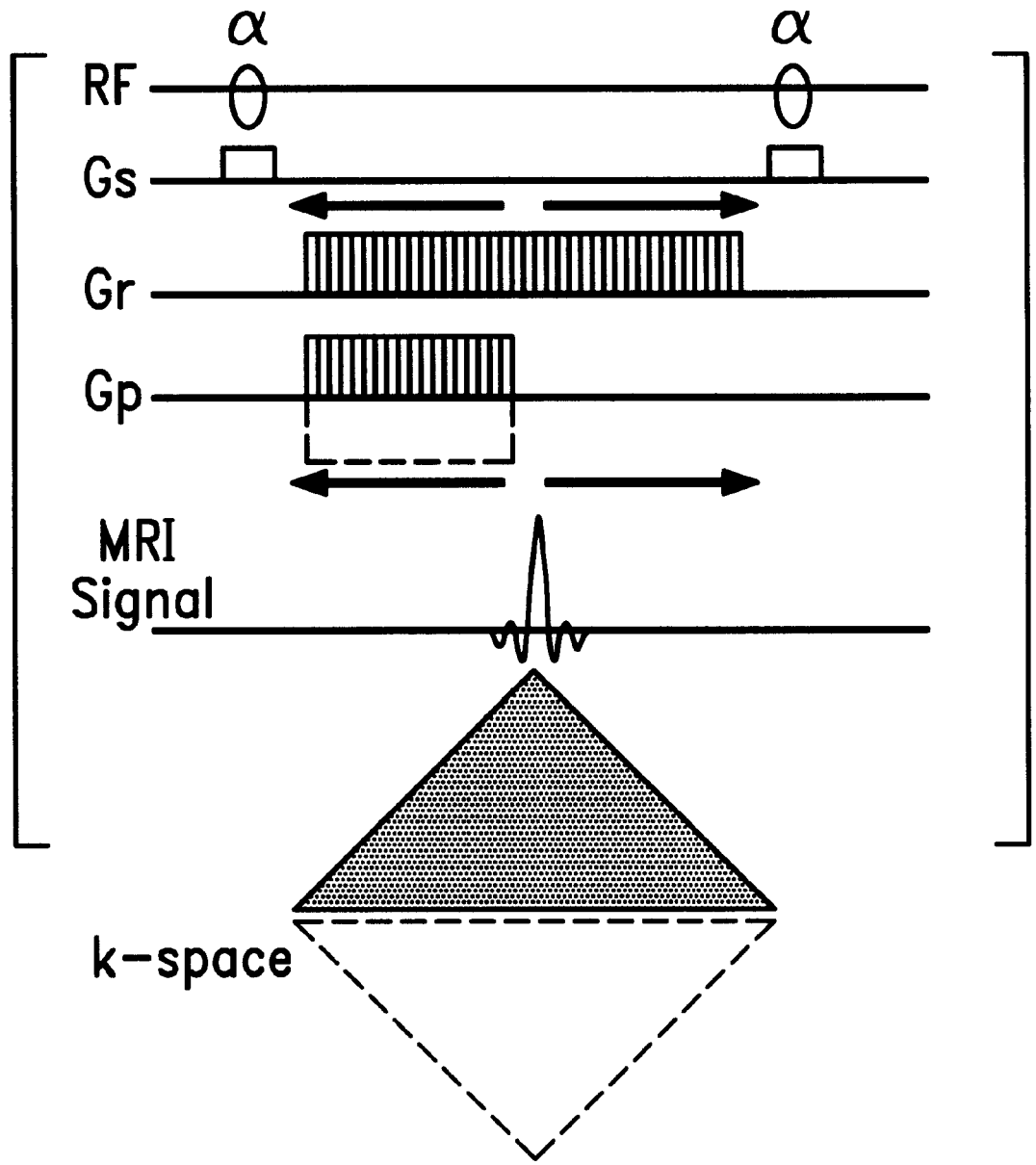
FIG. 7 illustrates an α-angled sequence in accordance with an example of the invention.

Referring to FIG. 7, in a broader sense the invention pertains to controlling the timing of read gradients and phase gradients to cause time variable overlap of at least a selected plurality of the phase gradients with respective ones of the read gradients such that the time interval over which read and time gradients overlap varies as between different phase gradients. FIG. 7 illustrates a non-CPMG pulse sequence with a sequence of $\alpha$-angled RF excitation pulses each coupled in time with an appropriate slice select gradient Gs. A read gradient Gr is applied in the time interval between successive ones of the $\alpha$-angled excitation RF signals and, in accordance with the invention, a phase gradient Gp overlaps in time with a portion of the read gradient. The duration of the overlap can vary with time as between different periods between successive $\alpha$-angled RF signals, and the MRI signal can be sampled only during the central portion of the read gradient (where there is no overlap with a phase gradient), in which case the sampled signal can be stored in a diamond-shaped K-space grid as illustrated. Alternatively, the MRI signal can be stored in differently shaped K-space areas or zero-filling can be used, as earlier discussed in connection with the TV CPMG sequence. Fewer MRI signal samples need be acquired in 3D FT imaging in accordance with the invention by not acquiring K-space values for locations in corners of the K-space 3D matrix so as to reduce imaging time. The time varying overlap principles of the invention can be combined with such acquisition of fewer MRI signal samples to give a spherical K-space 3D matrix.

Figure 8:
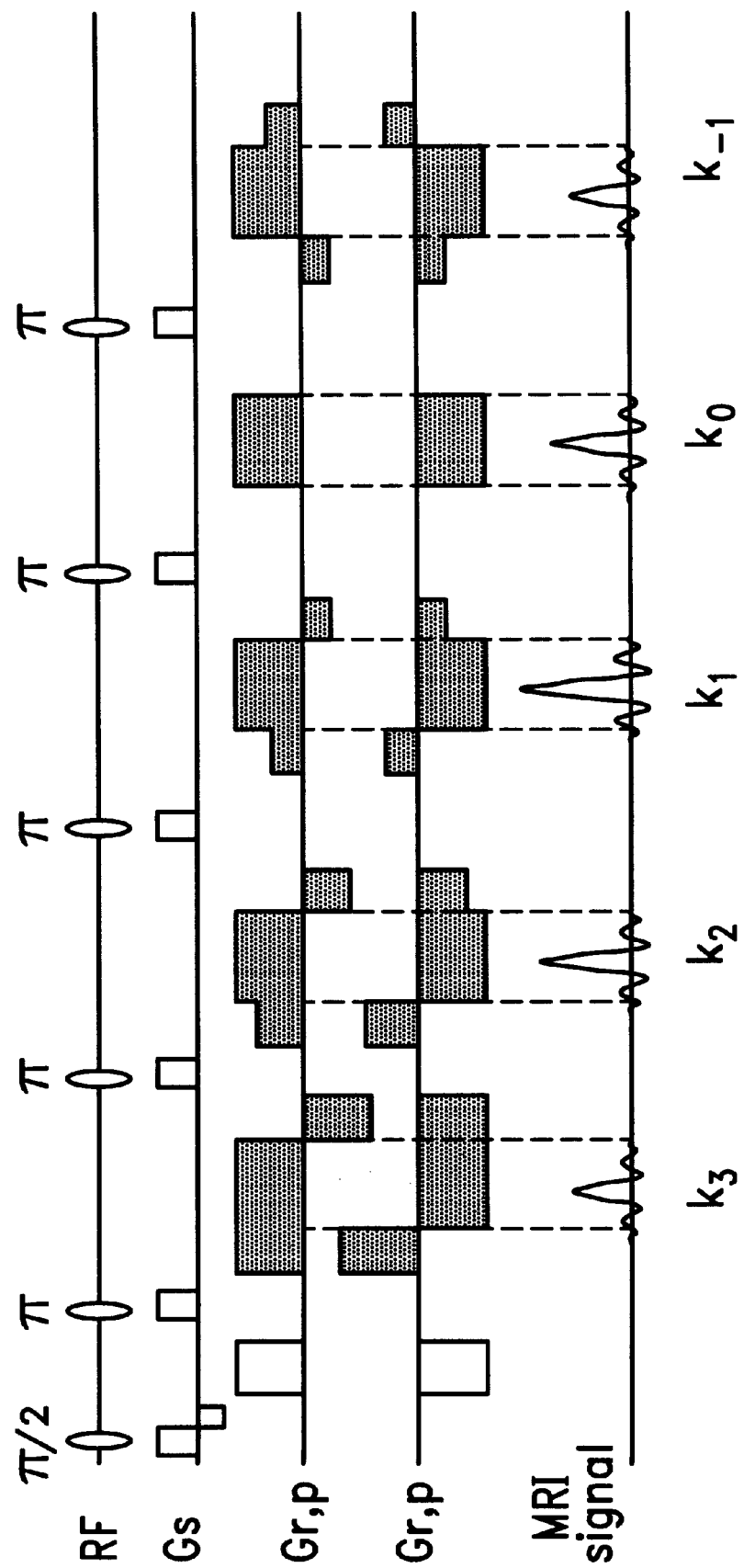
FIG. 8 illustrates a sequence which samples MRI signals for diagonal lines in K-space.
Figure 9:
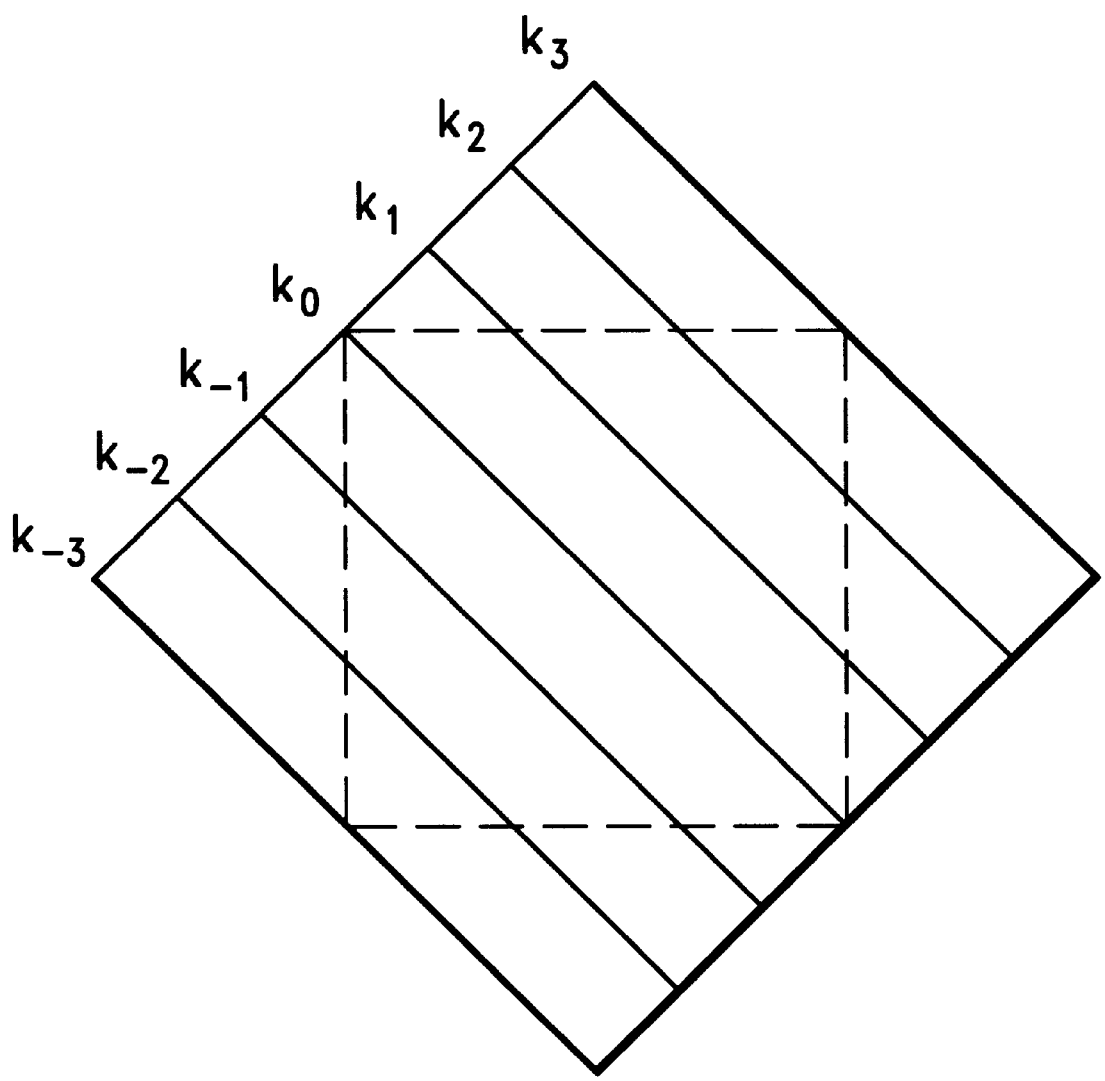
FIG. 9 illustrates a K-space grid for such MRI signals.

FIG. 8 illustrates a way or achieving greater K-space coverage by applying gradients simultaneously during the Gr gradient to obtain a diagonal trajectory in K-space, as illustrated in FIG. 9. Referring to FIG. 8, a $\pi/2$ RF signal is followed by a train if $\pi$ RF signals, and each RF signal coincides in time with a respective slice select gradient Gs as is conventional. Two read gradients which are orthogonal to each other are applied, both centered on the time of spin echo recording. In addition, two phase gradients which also are orthogonal to each other are applied simultaneously to create a phase encoding effect on the signals during the time interval between a $\pi$ RF signal and the immediately following spin echo recording time. Still in addition, two additional phase gradients are applied between the spin echo reading time and the next $\pi$ RF signal so that the net phase encoding is maintained a constant value for all intervals between successive $\pi$ RF signals. The MRI signal is recorded in a grid in K-space in which the data lines extend along a diagonal parallel to the data line at $k_0$ in FIG. 9. In the sequence illustrated in FIG. 6, the true sampling of the MRI signal is in the diagonal direction, as seen in FIG. 9 rather than in the rectilinear direction as seen for the case of a TV CPMG sequence in FIGS. 5a and 5b. Unlike the rectilinear storage as in FIGS. 5a and 5b, the diagonal storage of FIG. 9 does not correspond to the anatomical planes in the human body. An increased bandwidth is possible with the TV sequences in accordance with the invention when the MRI data is recorded in K-space rectilinearly, as in Figs. 5a and 5b. This is not believed to be the case with diagonal recording because it is believed to require a read period which always is half the duration of the interval between successive $\pi$ RF signals.

Figure 10:
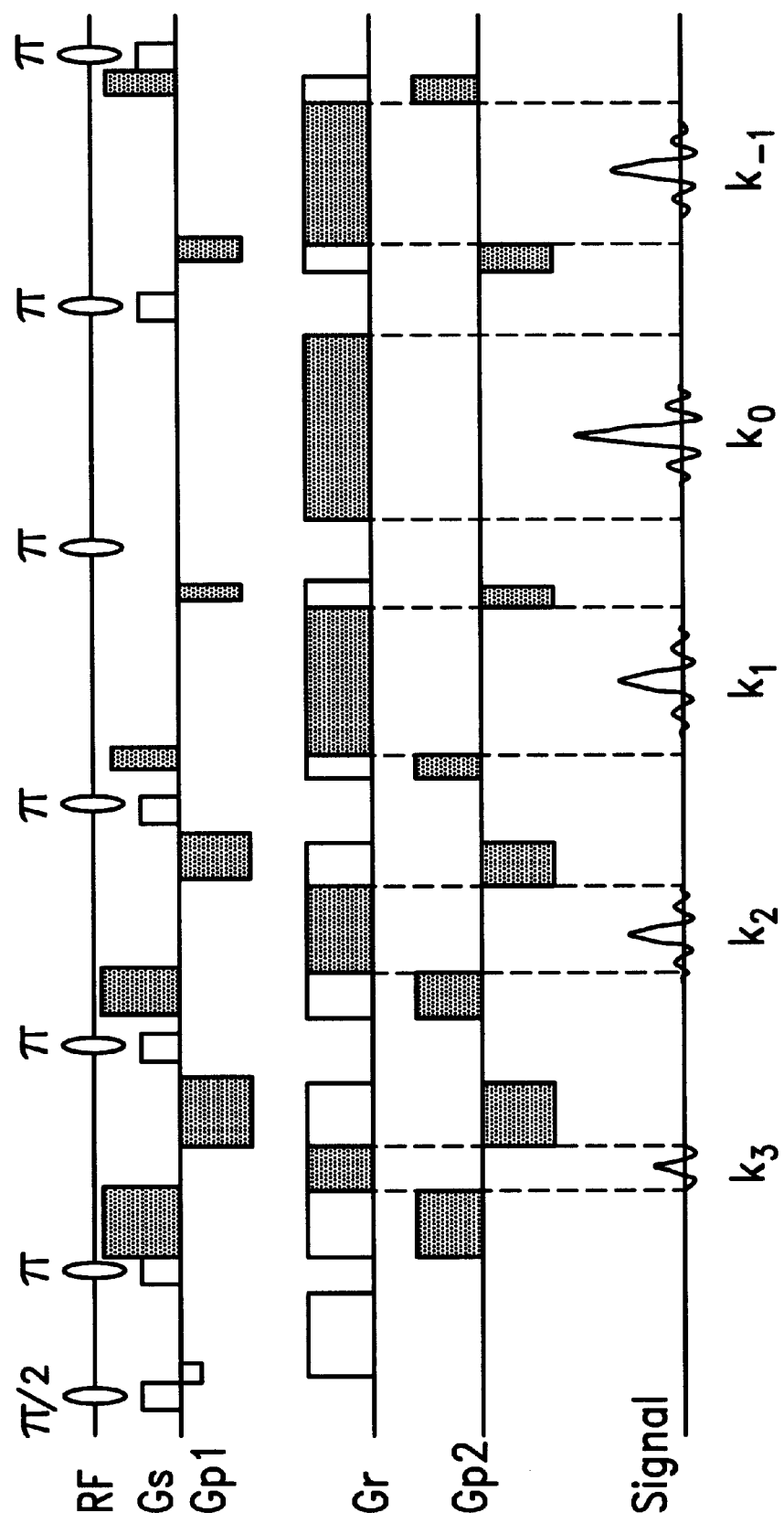
FIG. 10 illustrates a 3D sequence in accordance with another example of the invention.

FIG. 10 illustrates a 3D pulse sequence in accordance with another embodiment of the invention. The illustrated sequence is in the class of CPMG sequences, but makes use of overlap of read and phase gradients. In particular, FIG. 10 illustrates a sequence which is similar to that of FIG. 4 but, in place of the phase gradients Gp as in FIG. 2, uses phase gradients Gp1 and Gp2 which are orthogonal to each other so as to allow for 3D MRI signal acquisition. Phase gradient Gp1 is shown on the same axis as the slice select gradient Gs (but is active at different times) and phase gradient Gp2 is shown on a separate axis. As in the case of phase gradient Gp in FIG. 2, each of the phase gradients Gp1 and Gp2 is made up of pairs of phase encode and phase rewind gradients. The phase encode gradient of each of the phase gradients Gp1 and Gp2 is active at the same time, between a $\pi$ RF signal and the center of the following read gradient, and the phase rewind gradient of each of the phase gradients Gp1 and Gp2 is active at the same time, between the center of the read gradient and the following $\pi$ RF signal. In addition, as in the case of the phase gradients in FIG. 2, each of the phase gradients Gp1 and Gp2 overlaps with the read gradients Gr over time intervals which vary. As illustrated, only a small central part of the read gradient for $k_0$ is free of overlap, a longer central part for $k_2$ is free of overlap, etc., as in the case of FIG. 2. While FIG. 10 illustrates a type of a CPMG pulse sequence, similar considerations apply to other 3D sequences, in a manner similar to that discussed above in connection with a 2D $\alpha$-angle sequence. Specifically, a 3D $\alpha$-sequence can use, in accordance with the invention, a second phase gradient so that each of two orthogonal phase gradients would have a variable time overlap with the read gradients, in the manner discussed above for one phase gradient in the 2D case.

Figure 11:
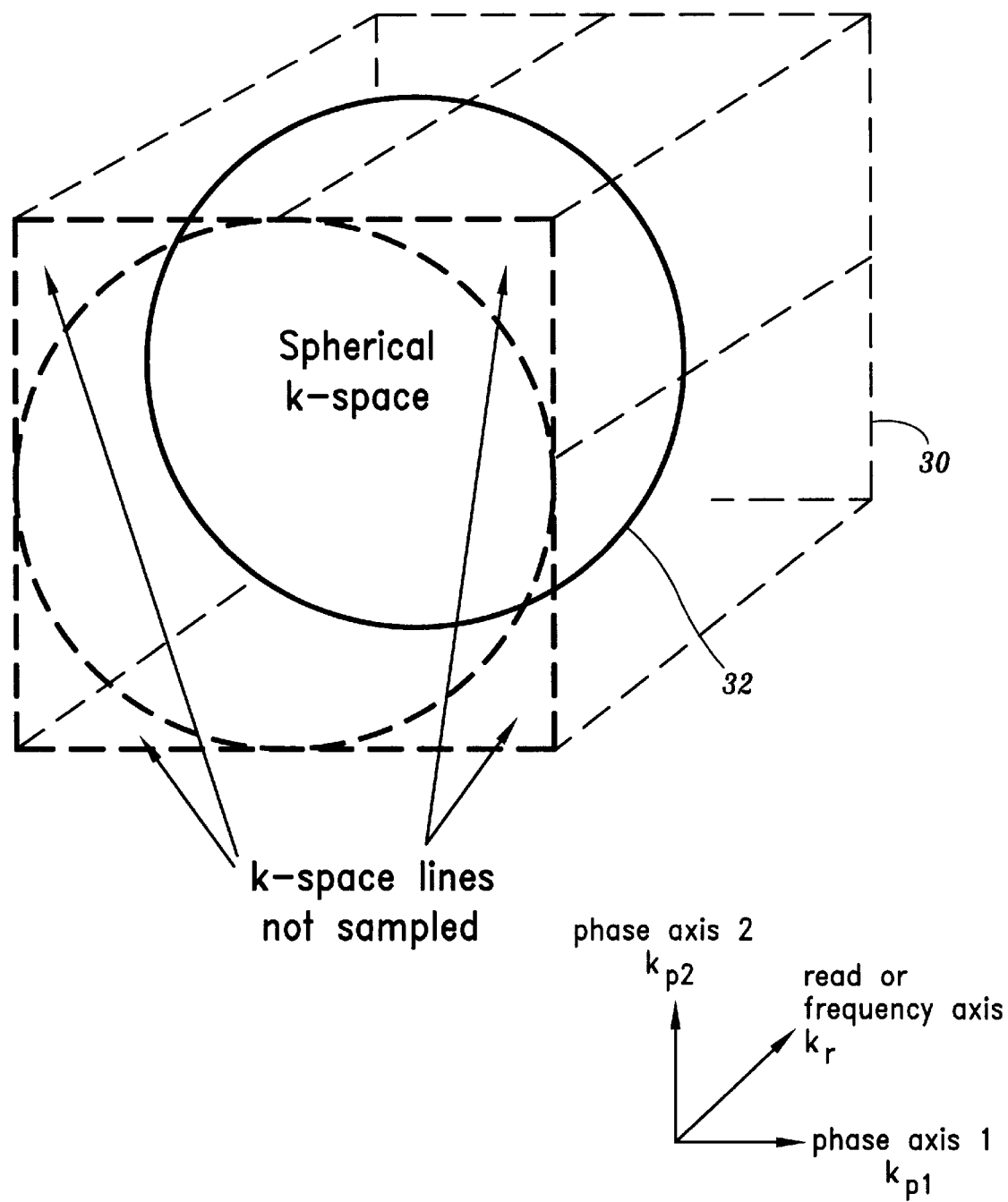
FIG. 11 illustrates K-space volumes relevant to a 3D sequence.

As illustrated in FIG. 11, the 3D MRI signals derived in the FIG. 10 sequence can be stored in a volume in 3D K-space, in lines which are parallel to a read or frequency axis $k_r$, and are spaced from each other along each a first phase axis $k_{p1}$ and a second phase axis $k_{p2}$ (the lines are not shown in FIG. 11). If no overlap is used in FIG. 10, i.e., the phase encode gradients precede and the phase rewind gradients follow the read gradients in time, the measured MRI signal typically would be stored in line in 3D K-space which form a cube or a box such as cube 30 in FIG. 11. However, with the overlap illustrated in FIG. 10, the MRI signals can be samples only when there is no overlap, in which case only the sphere 32 whose diameter equals a side of cube 30 would be populated with MRI signal samples. The corners of cube 30 would not contain MRI signals used for image reconstruction. Alternately, the corners can be filled with zero values that would be used in the FT image reconstruction together with the non-zero values in sphere 32. As another alternative, the entire cube 32 can be filled, without the use of overlap between phase and read gradients, but the corners outside the sphere 32 would be zero-filled in order to improve the image SNR.

In comparing the circular cross-section of sphere 32 to the square cross-section of cube 30, there are 22% fewer signals used to fill the spherical K-space volume and therefore there is a corresponding reduction in imaging time when only the signals in the spherical K-space volume are used in image reconstruction.

Figure 12:
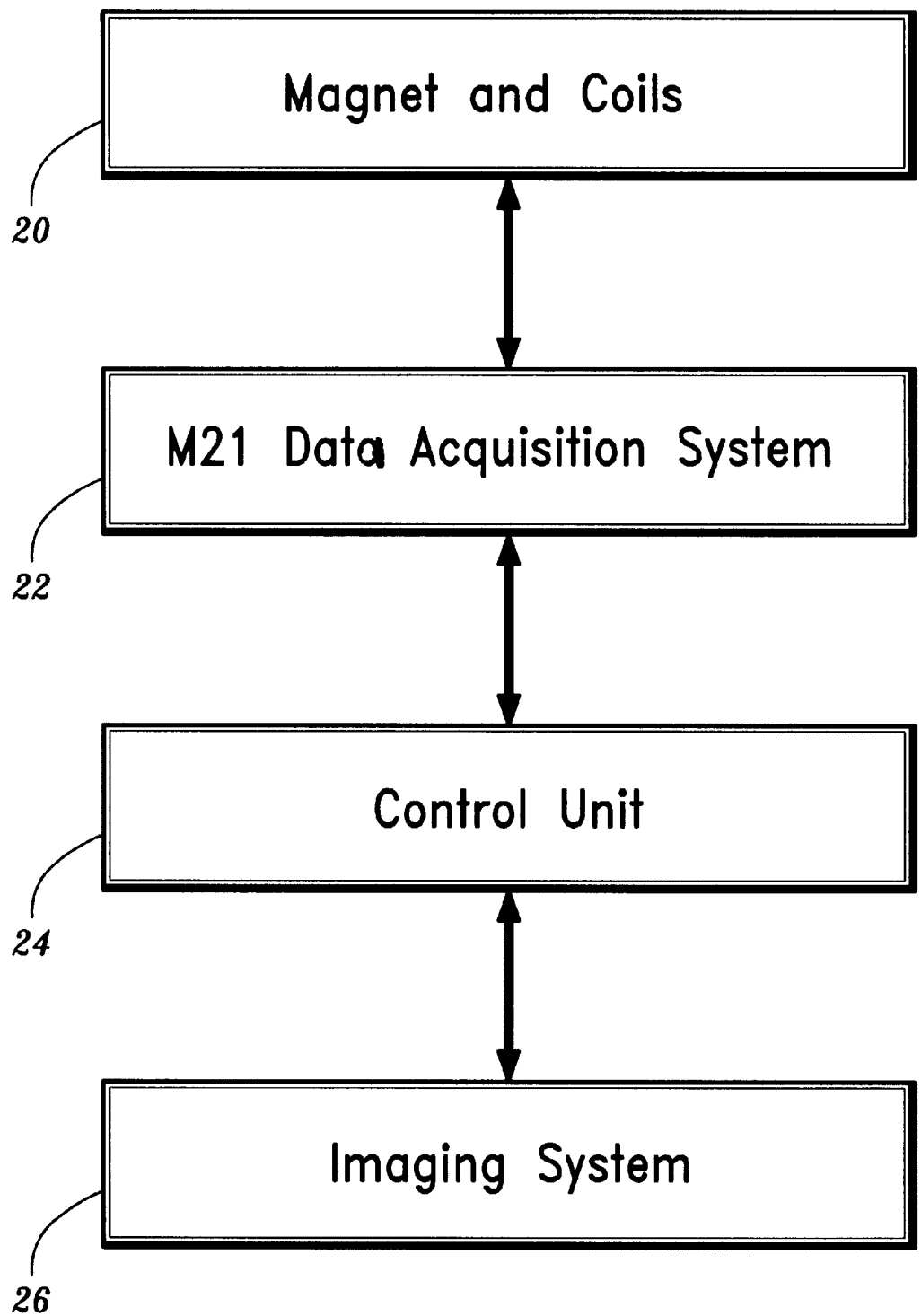
FIG. 12 is a block diagram illustration of an MRI system suitable for carrying out examples of the invention.

FIG. 12 illustrates an example of currently commercially available MRI system which can be programmed or otherwise modified to carry out examples of the invention and thereby become a system embodying the invention. The system comprises a unit 20 which comprises a magnet and appropriate patient handling hardware as well as RF and gradient coils, an MRI data acquisition system 22 which acquires MRI signals from the receiver coils and preliminarily processes those signals, a control unit 24 which controls various system functions, and an imaging system 26 which processes the MRI signals into MRI images. The control unit 24 and/or the imaging unit 26 can be programmed or otherwise modified in accordance with the invention to control the coils in unit 20 and the data acquisition system 22 to carry out TV sequences as discussed above.

Figure 13:
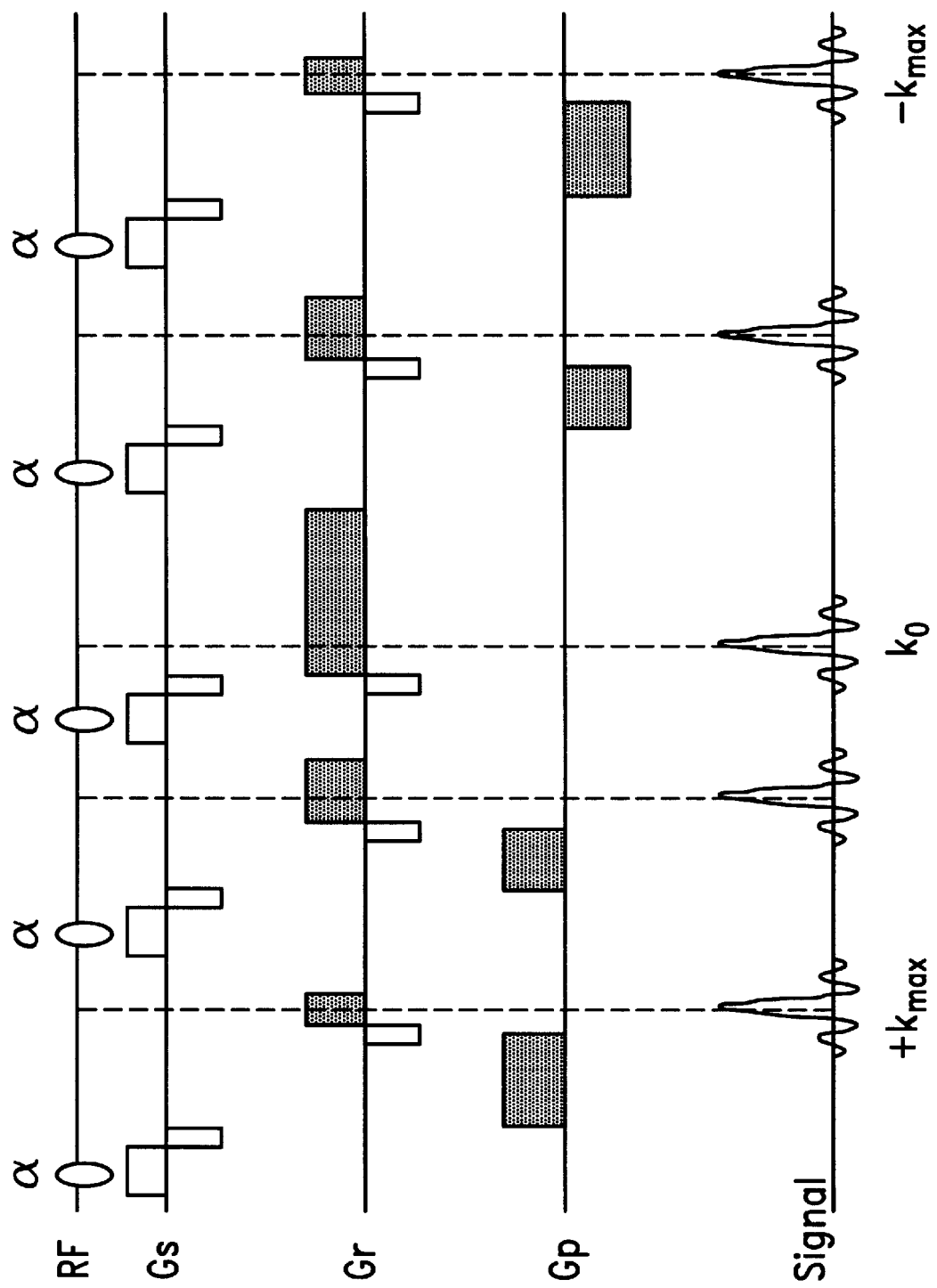
FIG. 13 illustrates a gradient echo pulse sequence using non-overlapping time-varying Gp and Gr pulses.

FIG. 13 illustrates another aspect of the invention—the use in certain pulse sequences, particularly gradient echo sequences, of variable pulse width phase Gp and readout Gr pulses which are not overlapping. As illustrated in FIG. 13, a succession of RF pulses designated $\alpha$ are used in a gradient echo MRI pulse sequence. The notation a indicates an arbitrary flip angle. A succession of Gs/p gradient pulses is used as is known in gradient echo pulse sequences. Following each Gs/p pulse, a phase gradient pulse Gp is used (illustrated as the black rectangle on the Gp line), and then a Gr pulse is used (except for the special case of the MRI signal at $k_0$). One or both of the Gp and Gr pulses can vary in width appropriately in accordance with the invention. In the illustrated example, each of Gp and Gr varies in width in complementary fashion, i.e., the sum of the widths of Gp and Gr remains constant but when moving from $+k_{max}$ toward $k_0$ the width of Gp gradually decreases while the width of Gr gradually increases, and this reverses when moving from $k_0$ toward $-k_{max}$. The Gp pulse does not overlap in time with the Gr pulse. While only two sets of a Gp and a Gr pulse are illustrated on each side of $k_0$, it should be understood that a typical practical MRI pulse sequence has many more such sets. In some cases it can be desirable to change only the widths of the Gp pulses while keeping the widths of the Gr pulses constant, or to chance only the widths of the Gr pulses while keeping the widths of the Gp pulses constant, and still achieve some of the advantages of the invention. As earlier noted, a gradient echo using these principles of the invention can be used for 2D or for 3D MRI data acquisition and imaging.

Figure 14:
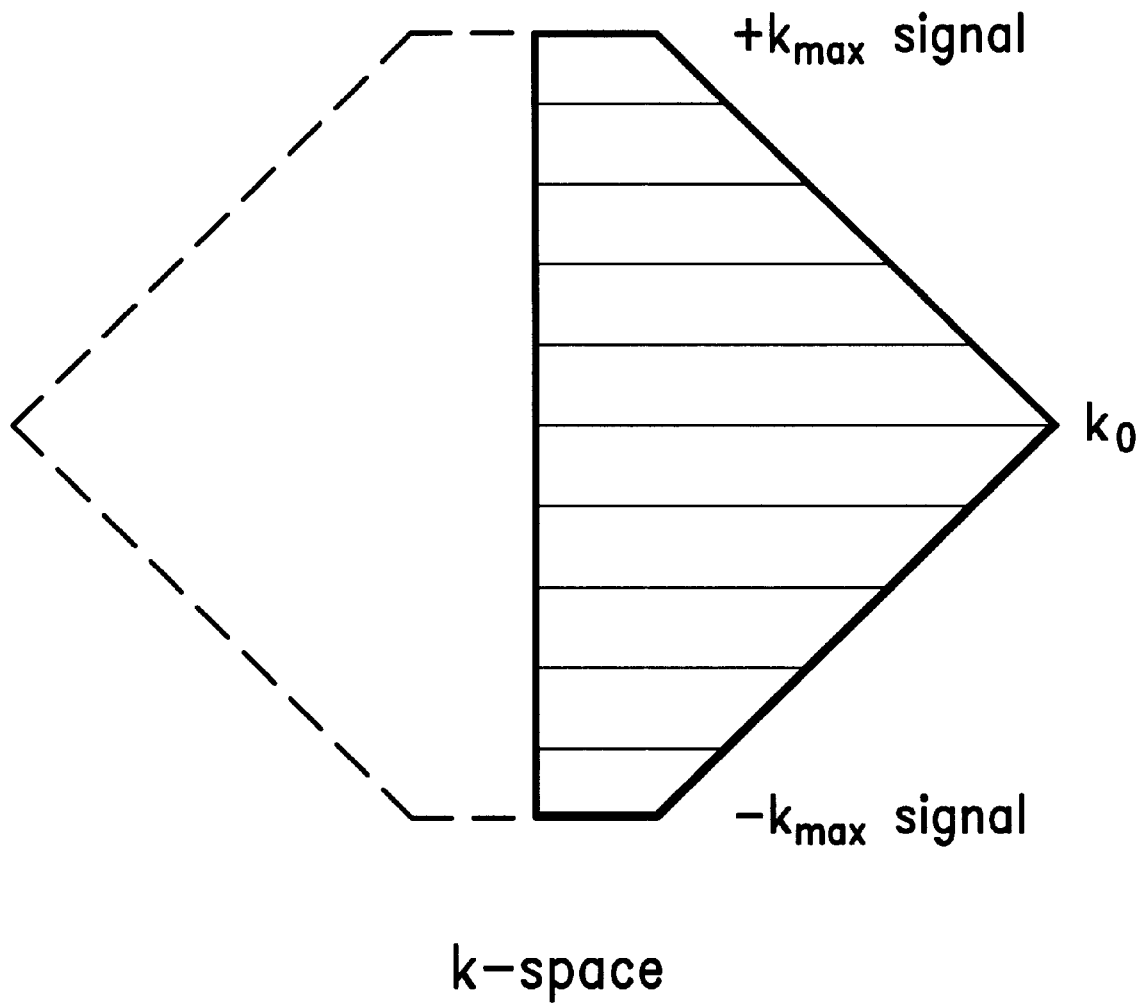
FIG. 14 illustrated a K-space diagram relevant to the pulse sequence of FIG. 13.

FIG. 14 illustrates a K-space corresponding to the gradient echo sequence illustrated in FIG. 13, where the solid lines illustrate in a conventional manner MRI data that have been actually acquired through the use of an MRI pulse sequence using the FIG. 13 principles while the dash line illustrates the left half of K-space which can be filled with synthesized half Fourier data.

It should be understood that the detailed description above is meant to illustrate some examples of the invention rather than all possible uses of the invention, and that the true scope of the invention is addressed in the appended claims.

I claim:

1. An MRI method utilizing a gradient echo MRI pulse sequence using read gradients and phase gradients wherein at least the phase gradients vary in width with time, comprising the steps of:

applying RF signals which are spaced from each other in time, and applying read gradients and phase gradients of magnetic field which are active at selected times relative to said RF signals;

controlling the timing of said read gradients and phase gradients to cause the width of at least a selected plurality of at least said phase gradients to change with closeness to a center of k-space;

deriving MRI signals at times related to said read gradients; and processing said MRI signals into MRI images.

2. An MRI method as in claim 1 in which said controlling comprises controlling the timing of said read gradients and phase gradients to cause time complementary variable changes in a width of successive phase gradients and said read gradients such that the width of successive read gradients increases as the width of successive phase gradients decreases and vice versa with the aggregate duration of the phase gradients and read gradients remaining approximately constant.

3. An MRI method utilizing a time variable overlap of read gradients and phase gradients, comprising the steps of:

applying RF signals which are spaced from each other in time, and applying read gradients and phase gradients of magnetic field which are active at selected times relative to said RF signals;

controlling the timing of said read gradients and phase gradients to cause time variable overlap of at least a selected plurality of said phase gradients with respective ones of said read gradients such that the time interval over which said read and phase gradients overlap varies;

deriving MRI signals at times related to said read gradients; and processing said MRI signals into MRI images.

4. A method as in claim 3 wherein said applying step comprises varying the amplitude with time of at least selected ones of said read gradients and/or phase gradients.

5. A method as in claim 3 wherein said processing step comprises the step of storing said MRI signals in K-space at lines which are parallel to a frequency axis and are spaced from each other along a phase axis, said lines occupying a non-rectangular area for non-zero MRI signals used in said processing step for processing into MRI images and for uniform sample distances along said lines.

6. A method as in claim 5 wherein said storing step comprises varying the lengths of said lines in K-space to make said non-rectangular area a diamond-shaped area of K-space.

7. A method as in claim 5 wherein said storing step comprises varying the lengths of said lines in K-space to make said non-rectangular area a circularly-shaped area of K-space.

8. A method as in claim 3 wherein said processing step comprises the step of storing said MRI signals in K-space except for storing a zero at coordinates in said K-space corresponding to time overlap between said read and phase gradients.

9. A method as in claim 3 wherein said step of applying phase gradients comprises applying phase gradients in two different directions and said processing step comprises the step of storing said MRI signals in three-dimensional K-space in lines which extend along a frequency axis and are spaced from each other along two different phase axes, said lines occupying a non-rectangular area in at least one plane containing said frequency axis and one of said phase axes.

10. A method as in claim 3 wherein said step of applying RF signals comprises applying a succession of sets each comprising a $\pi/2$ RF signal followed after a period $\tau$ by at least one $\pi$ RF signal.

11. A method as in claim 10 wherein said step of applying RF signals comprises applying a succession of sets each comprising a $\pi/2$ RF signal followed after a period $\tau$ by a succession of $\pi$ RF signal spaced from each other in time.

12. A method as in claim 11 wherein said step of applying said gradients comprises applying at least a read gradient after each of said $\pi$ RF signals.

13. A method as in claim 3 wherein said applying step comprises applying said RF signals and said gradient signals in a CPMG pulse sequence modified for said overlap between said phase and read gradients.

14. A method as in claim 13 wherein each of said phase gradients comprises a phase encode gradients and a phase rewind gradient which are spaced from each other in time each of which overlaps in time with a respective one of said read gradients.

15. A method as in claim 3 wherein said applying step comprises applying said RF signals and said gradient signals in a GRASE pulse sequence modified for said overlap between said phase and read gradients.

16. A method as in claim 3 wherein said deriving step comprises deriving MRI signals only during times when said read and phase gradients do not overlap.

17. A method as in claim 3 wherein said deriving step comprises deriving MRI signals both for times when said read and phase gradients overlap and times when said read and phase gradients do not overlap.

18. An MRI method utilizing a time variable overlap of read gradients and phase gradients in 3D MRI signals acquisition, comprising the steps of:

applying RF signals which are spaced from each other in times, and read gradients and first and second phase gradients of magnetic field which are active at selected times relative to said RF signals, wherein said first phase gradients are orthogonal to said second phase gradients for 3D MRI signal acquisition;

controlling the timing of said read gradients and said first and second phase gradients to cause time variable overlap of at least a selected plurality of said first phase gradients with respective ones of said read gradients and of said second phase gradients with respective ones of said read gradients such that the time intervals over which said read gradients overlap with said first and second phase gradients vary;

deriving MRI signals at times related to said read gradients; and processing said MRI signals into MRI images.

19. A method as in claim 18 wherein said processing step comprises storing said MRI signals in a three-dimensional K-space volume at lines which are parallel to a first axis in K-space which corresponds to one of said read gradients or first or second phase gradients, and are spaced from each other along two orthogonal axis which correspond to the remaining ones of said read gradients or first or second phase gradients, and comprises processing into said MRI images non-zero MRI signals stored in a spherical volume in said K-space.

20. A method of carrying out MRI data acquisition and imaging comprising the steps of:

acquiring MRI data by using a main magnetic field and readout gradients, phase encode gradients and phase rewind gradients, as well as successive RF excitation signals which are spaced from each other by respective successions of rephasing RF signals, and storing so-acquired MRI data as data lines which in K-space are parallel to a frequency axis and are spaced from each other along a phase axis;

controlling the timing and duration of said RF signals and said gradients such that an early and a late portion of each readout gradient for data lines spaced from a center of said phase axis in K-space overlaps in time with a phase encode and a phase rewind gradient, respectively, but a central portion remains free of such overlap;

wherein the time duration of said central portion of the readout gradient increases for data lines which are closer to said center of said phase axis in K-space to allow for a longer sampling time for data lines closer to said center of said phase axis; and processing data in said data lines to produce MRI images.

21. An MRI method comprising the steps of:

acquiring MRI data in a CPMG sequence in which read gradients and phase gradients are applied at the same time but the read gradients are longer than the phase gradients so that each read gradient has a sampling portion which follows the end of a respective phase gradient and is before the start of the next phase gradient;

wherein said sampling portions of the read gradients vary in duration as between different read gradients in the same CPMG sequence;

sampling an MRI signal during said sampling portions to derive MRI data; and processing said MRI data to produce MRI images.

22. A method as in claim 21 further comprising:

acquiring a spin echo MRI signal in an MRI examination of a body using a CPMG pulse sequence with a succession of 180° RF signals in which a part of each of a plurality of read gradients overlaps in time with a respective phase encode gradient and another part of each of said plurality of read gradients overlaps in time with a respective rewind gradient but a central part of each of said plurality of read gradients is free of overlap;

controlling said phase gradients and read gradients to cause a portion of the read gradients and phase encode gradients that overlap to refocus the phase dispersions of said MRI signal prior to said central parts of the read gradients, and to cause a portion of the read gradients and rewind gradients that overlap to cause the phase dispersion to match that existing before the application of each of said 180° RF signals;

thereby maintaining a constant net spin phase after each 180° RF signal in said CPMG pulse sequence.

23. A MRI system comprising:

a magnet and coils and a control unit applying to a body RF signals which are spaced from each other in time and read gradients and phase gradients of magnetic field which are active at selected times relative to said RF signals;

said control unit comprising circuits controlling the timing of said read gradients and phase gradients to cause time variable overlap of at least a selected plurality of said phase gradients with respective ones of said read gradients such that the time interval over which said read gradients and phase gradients overlap is made to vary;

an MRI signals acquisition system coupled with said coils and said control unit to derive MRI signals at times related to said read gradients; and an imaging system processing said MRI signals into MRI images.

* * * * *